(12) United States Patent
Moore

(10) Patent No.: US 6,844,756 B1
(45) Date of Patent: Jan. 18, 2005

(54) CONFIGURABLE DEDICATED LOGIC IN PLDS

(75) Inventor: Michael T. Moore, Santa Clara, CA (US)

(73) Assignee: Cypress Semiconductor Corp., San Jose, CA (US)

(*) Notice: Subject to any disclaimer, the term of this patent is extended or adjusted under 35 U.S.C. 154(b) by 0 days.

(21) Appl. No.: 09/804,523

(22) Filed: Mar. 12, 2001

Related U.S. Application Data

(60) Provisional application No. 60/213,633, filed on Jun. 23, 2000.

(51) Int. Cl.[7] .............................................. H03K 19/177
(52) U.S. Cl. ............................... 326/39; 326/38; 326/41
(58) Field of Search ....................... 326/37–41

(56) References Cited

U.S. PATENT DOCUMENTS

| | | | | |
|---|---|---|---|---|
| 4,631,686 A | * | 12/1986 | Ikawa et al. ................ | 364/490 |
| 5,448,185 A | * | 9/1995 | Kaptanoglu .................. | 326/39 |
| 5,874,834 A | * | 2/1999 | New ........................... | 326/39 |
| 6,211,697 B1 | * | 4/2001 | Lien et al. .................... | 326/41 |
| 6,323,680 B1 | * | 11/2001 | Pedersen et al. .............. | 326/41 |
| 6,362,650 B1 | * | 3/2002 | New et al. .................... | 326/41 |

* cited by examiner

*Primary Examiner*—Anh Q. Tran
(74) *Attorney, Agent, or Firm*—Christopher P. Maiorana, PC

(57) ABSTRACT

An apparatus comprising one or more logic circuits. The logic circuits may be configured to provide computation. The one or more logic circuits generally comprise dedicated logic within a programmable logic device (PLD).

23 Claims, 3 Drawing Sheets

CONFIGURABLE DEDICATED LOGIC IN PLDS

This application claims the benefit of U.S. Provisional Application No. 60/213,633, filed Jun. 23, 2000 and is hereby incorporated by reference in its entirety.

FIELD OF THE INVENTION

The present invention relates to a method and/or architecture for implementing programmable logic devices (PLDs) generally and, more particularly, to a method and/or architecture for implementing configurable dedicated logic in PLDs.

BACKGROUND OF THE INVENTION

Complex programmable logic devices (CPLDs) and field programmable gate arrays (FPGAs) are frequently implemented to compute arithmetic and other functions. Multiplication functions are complex, particularly for 32-bit inputs, and consume considerable device resources on both FPGA and CPLD devices. Additionally, multiplication functions are slow in CPLDs and/or FPGAs. However, multiplication functions are frequently used in digital signal processing (DSP) and communication areas, including signal processing, filtering, multimedia, etc.

An example of an approach for improving the performance of CPLDs and FPGAs using adders and comparators can be found in U.S. Pat. No. 5,448,185, which is hereby incorporated by reference in its entirety.

Conventional multiplication methods use considerable device resources, resulting in slow multiply functions. A multiply function can be implemented as discrete multiplication blocks (i.e., to create partial products) that are fed to an adder (i.e., to add all the partial products, with appropriate shifting). Conventional multiplication methods may force a user to implement a larger device than desirable, since additional functionality needs to be added around the multiplier. The size of the multiplier frequently limits resources available for other functionality of the device. For example, an 8×8 combinatorial signed multiplier requires approximately 66% of a cluster (2318 square mils of silicon) when implemented as programmable logic.

Additionally, CPLDs and FPGAs are frequently used to implement cyclic redundancy check (CRC) functions. CRC functions use a chain of XORs with a feedback that may be implemented as discrete blocks, in a similar manner to the way a multiplier can be implemented as discrete blocks. CRC functions are based on XOR chains and consume considerable resources on CPLDs, especially for 32-bit inputs. A 32-bit CRC function uses two logic blocks on a typical CPLD. CRC functions are used in the communications area for error checking and forward error correction. Several flavors of CRC are used in telecommunication devices.

One such conventional approach for CRC involves creating a XOR function from programmable logic resources on the device, usually from AND and OR gates, and sometimes also using a memory as a look-up-table (LUT). Such an implementation results in a large and/or slow function that requires a large area for implementation. Another such conventional approach for CRC involves creating a CRC function from the programmable logic resources on the device, usually from AND and OR gates, and sometimes using carry chain XORs. Such an implementation results in a slow function, which limits overall system performance. For example, a conventional 32-bit combinatorial XOR function runs at 61 MHZ max on a particular programmable technology and architecture. Conventional CRC approaches have (i) slow combinatorial functions or (ii) fast pipeline functions requiring multiple cycles of latency both of which limit overall system performance. For example, a 32-bit CRC requires 33 macrocells (i.e., 2 logic blocks), when pipelined can run at 140 MHz maximum and when non-pipelined can run at 70 MHz maximum for a particular programmable technology.

SUMMARY OF THE INVENTION

The present invention concerns an apparatus comprising one or more logic circuits. The one or more logic circuits may be configured to provide computations. The one or more logic circuits generally comprise dedicated logic within a programmable logic device (PLD).

The objects, features and advantages of the present invention include providing a method and/or architecture for implementing a configurable dedicated logic in PLDs that may (i) provide a fast multiplier functionality, (ii) provide higher performance multipliers, (iii) provide a space efficient approach for multipliers, (iv) allow an implementation of designs on smaller devices, (v) allow implementation of designs on cheaper device and/or (vi) reduce associated cost of multipliers (e.g., extra die area required). Alternatively, the present invention may provide a method and/or architecture for implementing a configurable dedicated logic PLDs that may (i) provide a fast CRC functionality (ii) provide higher performance CRC functionality, (iii) allow implementation of designs on smaller devices, (iv) allow implementation of designs on cheaper devices, and/or (v) reduce associated cost of CRC functions (e.g., the extra die area required).

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
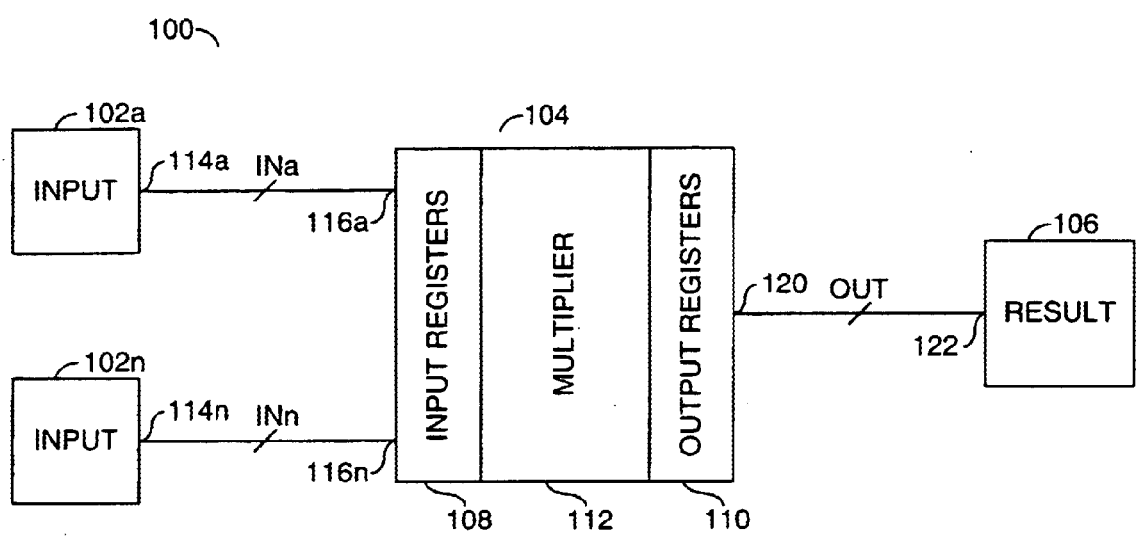
FIG. 1 is a block diagram of a preferred embodiment of the present invention.

Referring to FIG. 1, a block diagram of a circuit 100 is shown in accordance with a preferred embodiment of the present invention. The circuit 100 generally comprises a number of inputs 102a–102n, a logic block (or circuit) 104 and a result block (or circuit) 106. The logic block 104 may comprise an input register section 108, an output register section 110 and a logic section 112. In one example, the input register section 108 and the output register section 110 may be implemented as a single I/O register section. In another example, each of the input and output register sections 108 and 110 may comprise a number of registers. In another example, the logic section 112 may be implemented as a programmable logic section. In another example, the logic section 112 may be implemented as a multiplier. However, the input register section 108, the output register section 110 and the logic section 112 may each be implemented as another appropriate device in order to meet the criteria of a particular implementation.

Each of the inputs 102a–102n may have an output 114a–114n that may present a signal (e.g., INa–INn). Each of the signals INa–INn may be presented to an input 116a–116n of the input register section 108, respectively. For example, the input 102a may have the output 114a that may present the signal INa to the input 116a. Similarly, the input 102n may have the output 114n that may present the signal INn to the input 116n. In one example, the signals INa–INn may each be implemented as a multi-bit or a single-bit signal in a serial or parallel configuration.

The multiplier 112 may receive the input signals INa–INn from the input register section 108. The input register section 108 may store the input signals INa–INn. The multiplier 112 may be implemented to provide computation. The multiplier 112 may multiply the input signals INa–INn. However, the multiplier 112 may be implemented to complete other computations of the input signals INa–INn. The multiplied output may be presented to the output register section 110. The output register section 110 may store the multiplied output. The output register section 110 may have an output 120 that may present a signal (e.g., OUT). The signal OUT may be presented to an input 122 of the result circuit 106. In one example, the signal OUT may be implemented as a multiplied output of the multiplier 112. In another example, the signal OUT may be implemented as a multi-bit and/or single-bit signal in a serial or parallel configuration. The signal OUT may be generated in response to the signals INa–INn.

The circuit 100 may be implemented as a programmable logic device (PLD). The circuit 100 may provide an architecture for implementing configurable hard wired (e.g., dedicated logic) multiplier functionality of varying width in a PLD. A hard wired block is generally a fixed implementation of a given functional block on silicon. The inputs and outputs to the hard wired block may be connected to a routable interconnect. However, the hard wired block is not generally composed of programmable elements. It is composed of circuits implemented directly on silicon. Hard wired blocks are generally smaller and faster then the same functionality implemented utilizing programmable logic elements only.

The circuit 100 may provide an architecture for implementing configurable hard cyclic redundancy check (CRC) functionality of varying width in a PLD. Additionally, the circuit 100 may provide hard wired logic functionality of varying width. In one example, the circuit 100 may be implemented as a programmable logic configured as a variable width multiplier. In another example, the circuit 100 may be implemented as a hard wired, dedicated logic block. For example, the hard wired dedicated logic block may be implemented as a hard multiplier block on silicon (e.g., not composed of programmable elements). Additionally, the circuit 100 may be implemented as an adder, subtractor, CRC checker, divider, multiplier, comparator, parity generator, XOR trees, or other appropriate functions implemented as a hard wired block.

The circuit 100 may illustrate a single hard wired multiplier. However, the circuit 100 may implement another appropriate number of hard wired multipliers (to be described in connection with FIG. 2). Additionally, the hard wired multiplier 100 may be implemented with any appropriate width and/or depth in order to meet the criteria of a particular implementation. For example, the circuit 100 may be implemented with a number of 8-bit hard wired multipliers.

Figure 2:
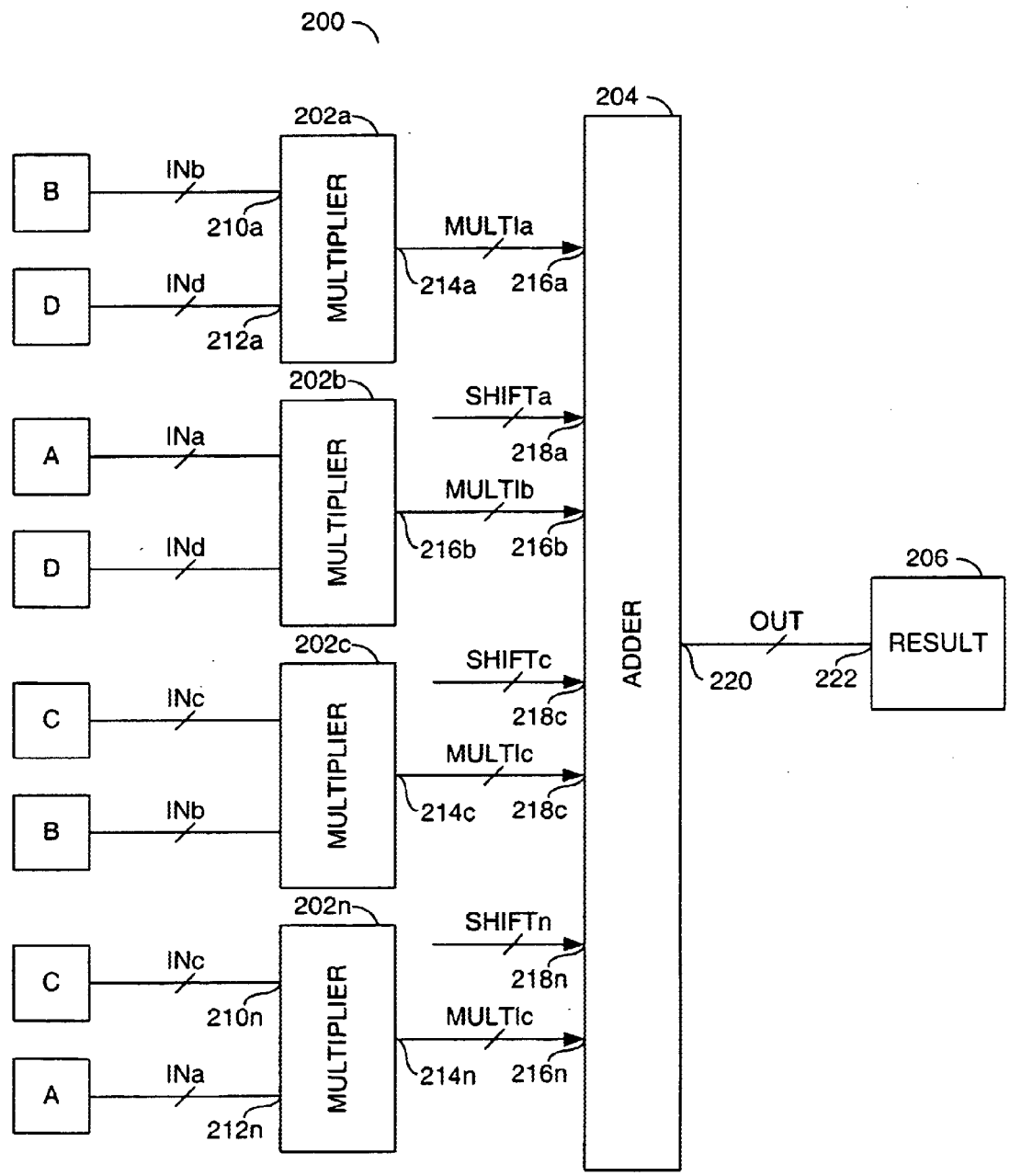
FIG. 2 is a block diagram of another embodiment of the present invention.

Referring to FIG. 2, a block diagram of a circuit 200 is shown in accordance with another preferred embodiment of the present invention. The circuit 200 generally comprises a number of logic circuits (or blocks) 202a–202n, an adder block (or circuit) 204 and a result block (or circuit) 206. In one example, each of the logic circuits 202a–202n may be implemented as multipliers. In another example, each of the logic circuits 202a–202n may have configuration similar to the logic circuit 100. However, each of the logic circuits 202a–202n may be implemented as another appropriate width and/or depth configuration in order to meet the criteria of a particular implementation. Each of the multipliers 202a–202n may have an input 210 and an input 212. The multipliers 202a–202n may receive a number of signals (e.g., INa–INn) at the inputs 210a–210n and the inputs 212a–212n. The signals INa–INn may each be implemented as single-bit and/or multi-bit signal in a parallel or serial configuration. For example, the multiplier 202a may have the input 210a that may receive the signal INb and the input 212a that may receive the signal INd.

Each of the multipliers 202a–202n may also have an output 214a–214n that may present a signal (e.g., MULTIa–MULTIn), respectively. Each of the signals MULTIa–MULTIn may be presented to an input 216a–216n of the adder block 204. In one example, the signals MULTIa–MULTIn may each be implemented as a multiplication output signal. In another example, the signals MULTIa–MULTIn may each be implemented as a single-bit and/or a multi-bit signal in a parallel or serial configuration.

The signals MULTIa–MULTIn may be presented to a number of inputs 216a–216n of the adder block 204, respectively. Additionally, the adder 204 may have a number of inputs 218a–218n that may receive a number of signals (e.g., SHIFTa–SHIFTn). In one example, the signals SHIFTa–SHIFTn may be implemented as shift inputs to a carry chain adder. In another example, the signals SHIFTa–SHIFTn may be implemented as bit shift signals into any adder. In another example, the signals SHIFTa–SHIFTn may be implemented as multi-bit signals. The shift signals SHIFTa–SHIFTn may be used when adding the partial products (MULTIa–MULTIn) to form the result of the multiply operation. For example:

$$\begin{array}{r}AB\\ *CD\\ \hline D.B\\ A.D\leftarrow\\ C.B\leftarrow\\ +\ C.A\leftarrow\leftarrow\\ \hline \text{RESULT}\end{array}$$

Where the arrows '←' may represent logical shifts and the '.' may indicate multiplication. The logical shifts SHIFTa––SHIFTn may be implemented as input signals to the carry chain adder, or to another appropriate type adder. Effectively, the shifts are generally replaced with 0 when the addition is done, so the result is:

RESULT=D.B+A.D0+C.B0+C.A00

The adder block 204 may also have an output 220 that may present a signal (e.g., OUT) to an input 222 of the result block 206. The signal OUT may be implemented as an addition result signal. Additionally, the signal OUT may be implemented, in one example, as a multi-bit and/or single-bit signal in a parallel or serial configuration. The signal OUT may be generated in response to the signals MULTIa–

MULTIn. Additionally, the signal OUT may be generated in response to the signals SHIFTa–SHIFTn. In one example, the adder 204 may be implemented as a 32-bit adder. In another example, the adder 204 may comprise a sequence of 8-bit or other appropriate size carry chain adders. In another example, the adder 204 may be implemented as a number of carry chain units of varying widths. However, the adder 204 may be implemented as another appropriate width and/or number of adders or carry chains in order to meet the criteria of a particular implementation.

The circuit 200 may illustrate a single hard wired multiplier. However, the circuit 200 may be implemented to provide a varying number and/or widths of multipliers. For example, the circuit 200 may be implemented with a number of 8-bit hard wired multipliers. The 8-bit hard wired multipliers 202a–202n may be configured as:

an 8-bit multiplier;
an 16-bit multiplier (e.g., using four 8×8 bit multipliers);
an 24-bit multiplier (e.g., using nine 8×8 bit multipliers); and an 32-bit multiplier (e.g., using sixteen 8×8 bit multipliers).

The hard wired 8-bit or any size multipliers 202a–202n may be connected, in one example, by a routable interconnect (e.g., a programmable interconnect matrix, not shown). The routable interconnect may link function blocks (e.g., the multipliers 202a–202n and the adder 204). Additionally, the routable interconnect may allow the 8-bit hard wired multipliers 202a–202n to be configured as a number of variable width multipliers. The signals SHIFTa–SHIFTn may allow addition of the partial products created by the multiply function (e.g., the signals MULTIa–MULTIn).

Figure 3:
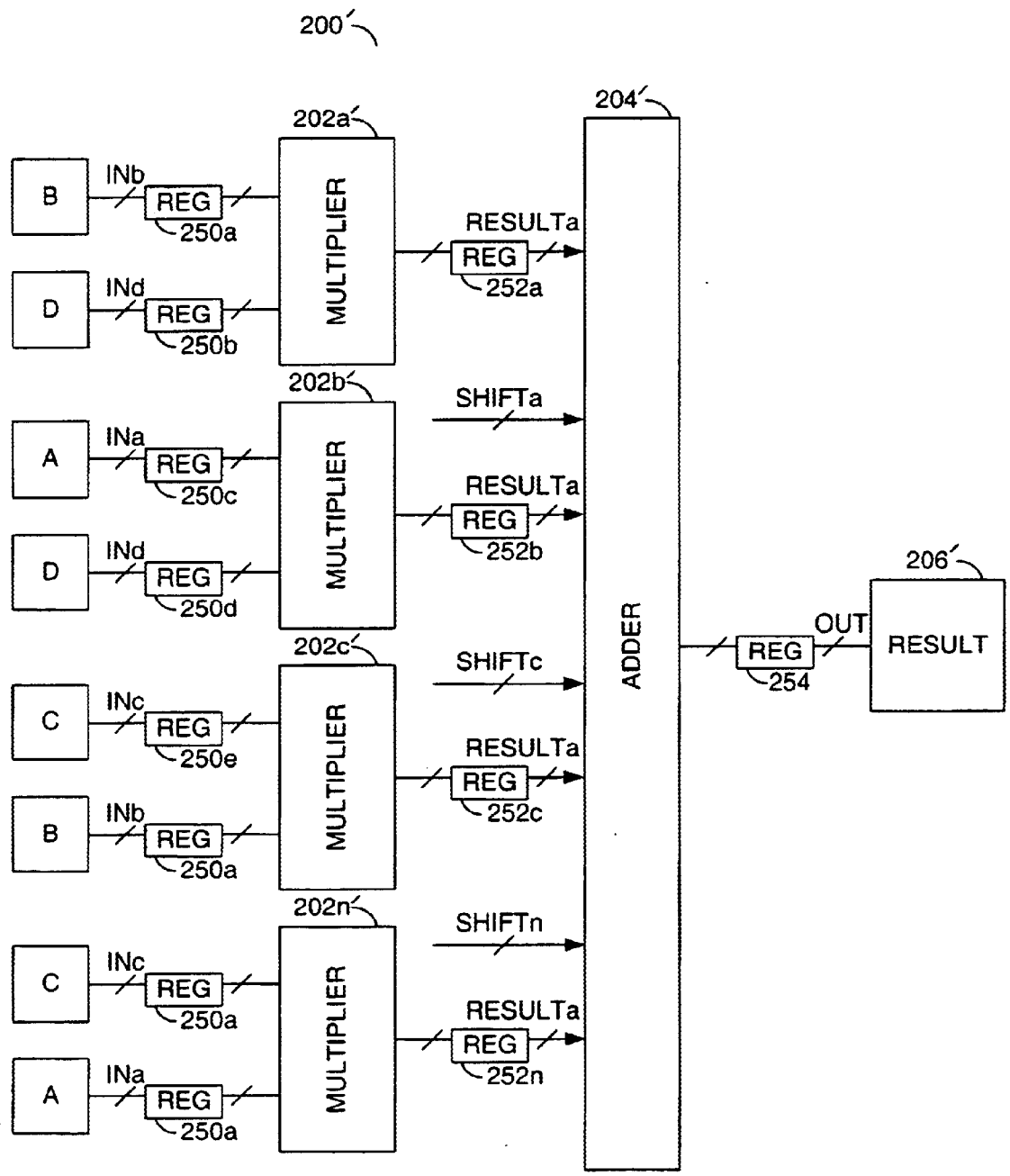
FIG. 3 is a block diagram of another embodiment of the present invention.

Referring to FIG. 3, a block diagram of another preferred embodiment of the present invention is shown, marked with primed notation. The circuit 200' may be similar to the circuit 200. The circuit 200' may illustrate a pipeline configuration of the circuit 200. The circuit 200' may additionally comprises a number of registers 250a–250n, (where n is an integer) a number of registers 252a–252n (where n is an integer) and a register 254. A particular number of registers 250a–250n, 252a–250n and 254 may be varied in order to meet the criteria of a particular implementation. In one example, the registers 250a–250n, 252a–250n and 254 may be implemented as pipeline register stages. However, other appropriate type registers and/or stages may be implemented in order to meet the criteria of a particular implementation. The registers 250a–250n, 252a–250n and 254 may be implemented to increase a throughput of the circuit 200'. However, the circuit 200' may require extra cycles of latency.

The multiplier 100 (or 200) may require less die area (e.g., an estimate 6 square mils of silicon for a 8-bit multiplier on a 0.18 μm process) than an equivalent multiplier implemented as programmable logic. Additionally, the multipliers 100 may allow a reduced size of implementation allowing increased availability for other functionality. The circuit 100 may result in a faster (because it is smaller and has less routing delays) multiplier that may provide increased performance over conventional multiplier implementations. The multiplier 100 may be implemented in communication devices and/or designs. The circuit 100 may be particularly suited for digital signal processing (DSP) devices and/or designs.

The circuit 100 may provide a fast and reduced area multiplier and/or adds solution to a user, since the circuit 100 may already have an implemented multiplier. The multiplier may require a minimal die area to implement hard multipliers. If a user requires a multiplier in a design, the multiplier 100 may allow a multiplier without any significant programmable logic resources. However, if the user does not require a multiplier in a design, then the hard multiplier 100 may not occupy a significant amount of die area.

The circuit 100 may allow the user to implement a design on a smaller and/or cheaper device. The circuit 100 may reduce cost of implementing a multiplier in a programmable logic device. Additionally, the circuit 100 may provide an architecture for implementing configurable hard wired multiplier functionality in CPLDs.

Alternatively, the circuit 100 (or 200) may be implemented to provide fast CRC functionality. Furthermore, the 100 may provide increased CRC performance over conventional CRC architectures. The hard wired 8-bit XORs 202a–202n may be configured as:

an 8-bit CRC (e.g., 8-bit XOR gate);
an 16-bit CRC (e.g., 2×8-bit XOR gates);
an 24-bit CRC (e.g., 3×8-bit XOR gates); and
an 32-bit (or above) CRC (e.g., 4(or more)×8-bit XOR gates).

The hard wired 8-bit XOR gates 202a–202n may have programmable feedback coefficients. The programmable coefficients may allow any flavor of CRC to be implemented (e.g., 12-bit CRC, 16-bit CRC, etc.).

The circuit 100 (or 200) may provide a fast CRC configuration. The circuit 100 may provide increased performance over conventional CRC architectures. The circuit 100 may be implemented in the communications area, where CRCs may be frequently used. The circuit 100 may provide a fast and essentially free CRC solution to a user, since the circuit 100 may already have an implemented CRC functionality. The circuit 100 may allow the user to implement a design on a smaller and/or cheaper device. The circuit 100 may reduce cost of implementing CRC functionality. Additionally, the circuit 100 may provide an architecture (e.g., inserting registers between stages to pipeline a design) for implementing configurable hard wired CRC functionality in PLDs.

While the invention has been particularly shown and described with reference to the preferred embodiments thereof, it will be understood by those skilled in the art that various changes in form and details may be made without departing from the spirit and the scope of the invention.

What is claimed is:

1. An apparatus comprising:
one or more logic circuits configured to provide logical operation, wherein said one or more logic circuits comprise (i) programmable logic elements and (ii) non-programmable hard wired blocks having no programmable elements within a programmable logic device (PLD), wherein said programmable logic elements are (i) configurable between two or more different logical functions and (ii) connectable by a routable interconnect circuit;
one or more first registers configured to couple one or more input signals to said non-programmable hard wired blocks; and
one or more second registers configured to receive one or more output signals from said non-programmable hard wired blocks.

2. The apparatus according to claim 1, wherein said one or more logic circuits comprise variable width logic circuits.

3. The apparatus according to claim 2, wherein a width of each of said one or more logic circuits is determined in response to one or more input signals.

4. The apparatus according to claim 1, wherein each of said one or more logic circuits is configured to receive one or more inputs comprising one or more of a multi-bit signal and a single-bit signal in one or more of a serial configuration and a parallel configuration.

5. The apparatus according to claim 1, wherein one or more of said non-programmable hard wired blocks comprises a hard wired multiplier.

6. The apparatus according to claim 1, wherein one or more of said non-programmable hard wired blocks are configured to perform cyclic redundancy check (CRC) functions.

7. The apparatus according to claim 1, wherein one or more of said logic circuits are configured to present one or more outputs.

8. The apparatus according to claim 7, wherein said one or more outputs comprise intermediate signals.

9. The apparatus according to claim 7, further comprising:
an adder circuit configured to receive said one or more outputs.

10. The apparatus according to claim 1, wherein said routable interconnect circuit is configured to route one or more of signals to one or more of said non-programmable hard wired blocks and signals from one or more of said non-programmable hard wired blocks.

11. The apparatus according to claim 10, further comprising a number of registers configured to increase a throughput of said one or more logic circuits.

12. The apparatus according to claim 1, wherein each of said one or more logic circuits comprise an input portion configured to store one or more input signals.

13. The apparatus according to claim 12, wherein each of said one or more logic circuits comprises an output portion configured to store an output.

14. An apparatus comprising:
means for receiving one or more input signals;
means for performing logical operation on said input signals using (i) programmable logic elements and (ii) non-programmable hard wired blocks having no programmable elements within a programmable logic device (PLD), wherein said programmable logic elements are (i) configurable between two or more different logical functions and (ii) connectable by a routable interconnect circuit;
means for storing one or more input signals to said non-programmable hard wired blocks; and
means for storing one or more output signals from said non-programmable hard wired blocks.

15. A method for computing in a programmable logic device (PLD) comprising the steps of:
(A) receiving one or more input signals;
(B) performing logical operation on said one or more input signals with (i) programmable logic elements and (ii) non-programmable hard wired blocks having no programmable elements within said programmable logic device, wherein said programmable logic elements are (i) configurable between two or more different logical functions and (ii) connectable by a routable interconnect circuit;
(C) storing one or more input signals to said non-programmable hard wired blocks; and
(D) storing one or more output signals from said non-programmable hard wired blocks.

16. The method according to claim 15, further comprising the step of:
(E) generating one or more outputs.

17. The method according to claim 15, wherein step (B) further comprises:
multiplying said one or more input signals with one or more of said hard wired blocks.

18. The method according to claim 16, wherein step (B) further comprises:
receiving said one or more outputs and adding said one or more outputs.

19. The method according to claim 16, wherein step (E) further comprises:
routing said one or more outputs with said routable interconnect circuit.

20. The apparatus according to claim 1, wherein said non-programmable hard wired blocks comprise dedicated logic having a fixed implementation of a given functional block on silicon.

21. The apparatus according to claim 1, wherein said programmable elements comprise configurable macrocells.

22. The apparatus according to claim 1, wherein said non-programmable hard wired blocks (i) comprise hard wired multipliers having a first width and (ii) are couplable to form one or more multipliers having a second width.

23. An apparatus comprising:
one or more logic circuits configured to provide logical operation, wherein said one or more logic circuits comprise (i) programmable logic elements and (ii) non-programmable hard wired blocks having no programmable elements within a programmable logic device (PLD), wherein said programmable logic elements are (i) configurable between two or more different logical functions, (ii) connectable by a routable interconnect circuit and (iii) each of said one or more logic circuits is configured to receive one or more inputs comprising one or more of a multi-bit signal and a single-bit signal in one or more of a serial configuration and a parallel configuration.

* * * * *